United States Patent
Li et al.

(10) Patent No.: US 10,560,053 B2
(45) Date of Patent: Feb. 11, 2020

(54) DIGITAL FRACTIONAL FREQUENCY DIVIDER

(71) Applicant: Qorvo US, Inc., Greensboro, NC (US)

(72) Inventors: Xia Li, Utrecht (NL); Hendrik Arend Visser, Wijchen (NL)

(73) Assignee: Qorvo US, Inc., Greensboro, NC (US)

( * ) Notice: Subject to any disclaimer, the term of this patent is extended or adjusted under 35 U.S.C. 154(b) by 102 days.

(21) Appl. No.: 15/927,599

(22) Filed: Mar. 21, 2018

(65) Prior Publication Data

US 2018/0287558 A1 Oct. 4, 2018

Related U.S. Application Data

(60) Provisional application No. 62/481,424, filed on Apr. 4, 2017.

(51) Int. Cl.
| | | |
|---|---|---|
| *H03L 7/00* | (2006.01) | |
| *H03C 3/09* | (2006.01) | |
| *H03L 7/197* | (2006.01) | |
| *H03D 7/16* | (2006.01) | |

(52) U.S. Cl.
CPC ......... *H03C 3/0933* (2013.01); *H03C 3/0925* (2013.01); *H03D 7/163* (2013.01); *H03L 7/1976* (2013.01)

(58) Field of Classification Search
CPC .... H03C 3/0933; H03C 3/0925; H03D 7/163; H03L 7/1976; H03L 7/24; H03K 3/0315; H03K 23/58; H03K 5/1565; H03K 5/15046; G06F 1/022; H03B 27/00
USPC ............................ 331/10; 327/115, 117, 248
See application file for complete search history.

(56) References Cited

PUBLICATIONS

Chandrashekar, K., et al., "A 32nm CMOS All-Digital Reconfigurable Fractional Frequency Divider for LO Generation in Multistandard SoC Radios With On-the-Fly Interference Management," 2012 IEEE International Solid-State Circuits Conference Digest of Technical Papers (ISSCC), Feb. 19-23, 2012, San Francisco, California, USA, pp. 352-354.
Liu, J., et al., "A 0.012mm2 3.1mW Bang-Bang Digital Fractional-N PLL with a Power-Supply-Noise Cancellation Technique and a Walking-One-Phase-Selection Fractional Frequency Divider," 2014 IEEE International Solid-State Circuits Conference Digest of Technical Papers (ISSCC), Feb. 9-13, 2014, San Francisco, California, USA, pp. 268-270.
Pellerano, S., et al., "A 4.75-GHz Fractional Frequency Divider-by-1.25 With TDC-Based All-Digital Spur Calibration in 45-nm CMOS," IEEE Journal of Solid-State Circuits, vol. 44, Issue 12, Dec. 11, 2009, pp. 3422-3433.

*Primary Examiner* — Richard Tan
(74) *Attorney, Agent, or Firm* — Withrow & Terranova, P.L.L.C.

(57) ABSTRACT

Frequency synthesizer circuitry includes multi-phase clock generator circuitry, frequency divider circuitry, signal retiming circuitry, and signal combining circuitry. The multi-phase clock generator circuitry receives an input clock signal and generates a number of multi-phase clock signals. The frequency divider circuitry also receives the input clock signal and performs frequency division thereon to generate a reference signal. The signal retiming circuitry receives the reference signal and the multi-phase clock signals and generates a number of retiming signals. The signal combining circuitry combines two of the retiming signals to provide an output clock signal that has the same frequency as the reference signal but a different duty cycle.

18 Claims, 9 Drawing Sheets

DIGITAL FRACTIONAL FREQUENCY DIVIDER

RELATED APPLICATIONS

This application claims the benefit of provisional patent application Ser. No. 62/481,424, filed Apr. 4, 2017, the disclosure of which is hereby incorporated herein by reference in its entirety.

FIELD OF THE DISCLOSURE

The present disclosure relates to frequency dividers, and specifically to fractional frequency dividers with improved performance characteristics.

BACKGROUND

Frequency synthesizers are commonly used to generate signals with one or more desired frequencies from a single fixed-frequency reference signal. The signals generated by frequency synthesizers may be used, for example, for the transmission and reception of radio frequency (RF) signals. To reduce the frequency of a reference signal, frequency synthesizers perform frequency division. This frequency division may be performed at integer values or fractional values. Performing frequency division at integer values is significantly less complex than doing so at fractional values. However, many applications demand fractional frequency division.

There are several conventional circuit topologies for performing both integer and fractional frequency division. However, these conventional circuit topologies generally suffer from slow start up times, high power consumption, and high jitter. While more recent developments to the conventional circuit topologies for fractional frequency division have focused on fixing one or more of the above problems, these conventional circuit topologies are often overly complex, relying on techniques such as multi-phase input clocking.

In light of the above, there is a need for frequency synthesizer circuitry that is capable of performing fractional frequency division with a fast start up time, low power consumption, low jitter, and reduced complexity.

SUMMARY

In one embodiment, frequency synthesizer circuitry includes multi-phase clock generator circuitry, frequency divider circuitry, signal retiming circuitry, and signal combining circuitry. The multi-phase clock generator circuitry receives an input clock signal and generates a number of multi-phase clock signals, each of which has the same frequency and duty cycle as the input clock signal but a different phase shift with respect thereto. The frequency divider circuitry also receives the input clock signal and performs frequency division thereon to generate a reference signal that has a different frequency and duty cycle than the input clock signal. The signal retiming circuitry receives the reference signal and the multi-phase clock signals and generates a number of retiming signals, each of which is a phase-shifted version of the reference signal, where the amount of phase shift of a particular one of the retiming signals is based on the phase shift of the one of the multi-phase clock signals used to generate the retiming signal. The signal combining circuitry combines two of the retiming signals to provide an output clock signal that has the same frequency as the reference signal but a different duty cycle. Performing frequency division in this manner significantly reduces the complexity of the frequency synthesizer circuitry and allows for a completely digital implementation, which reduces power consumption as well.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
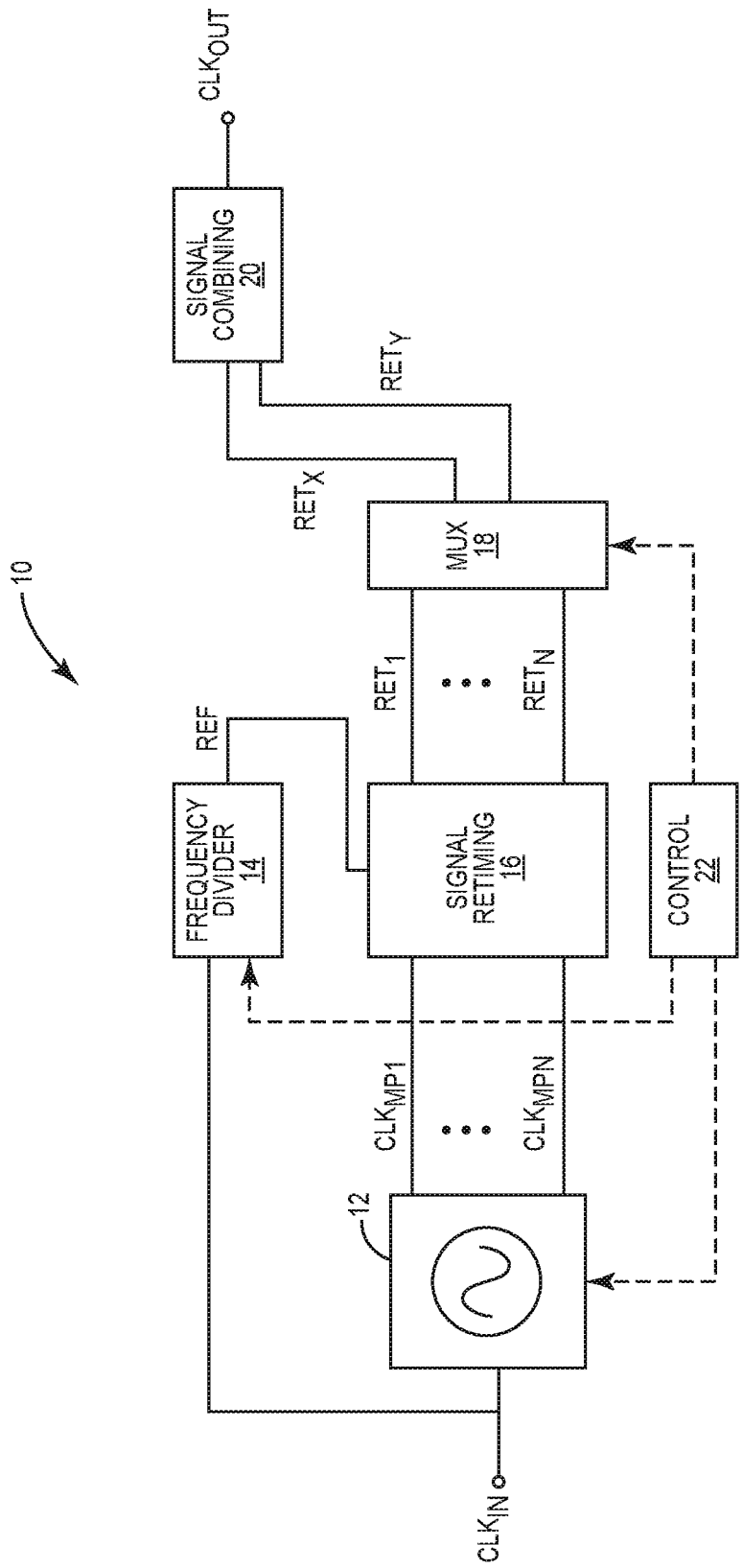
FIG. 1 is a diagram illustrating frequency synthesizer circuitry according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a diagram illustrating frequency synthesizer circuitry 10 according to one embodiment of the present disclosure. The frequency synthesizer circuitry 10 includes multi-phase clock generator circuitry 12, frequency divider circuitry 14, signal retiming circuitry 16, multiplexer circuitry 18, signal combining circuitry 20, and control circuitry 22. The multi-phase clock generator circuitry 12 is coupled to the signal retiming circuitry 16. The frequency divider circuitry 14 is coupled to the signal retiming circuitry 16. The multiplexer circuitry 18 is coupled between the signal retiming circuitry 16 and the signal combining circuitry 20. The control circuitry 22 is coupled to the multi-phase clock generator circuitry 12, the frequency divider circuitry 14, and the multiplexer circuitry 18. In operation, the multi-phase clock generator circuitry 12 receives an input clock signal $CLK_{IN}$ having a given frequency, duty cycle (e.g., 50%), and phase, and provides a number of multi-phase clock signals $CLK_{MP}$ (shown individually as $CLK_{MP1}$ through $CLK_{MPN}$), each of which has the same frequency and duty cycle as the input clock signal $CLK_{IN}$ but a different phase shift with respect thereto. In one embodiment, the multi-phase clock generator circuitry 12 is an injection-locked ring oscillator including a number of inverters each configured to sequentially shift the input clock signal $CLK_{IN}$ in phase to generate the multi-phase clock signals $CLK_{MP}$. As discussed in detail below, using an injection-locked ring oscillator to generate the multi-phase clock signals $CLK_{MP}$ may significantly reduce start-up times, energy consumption, and complexity of the frequency synthesizer circuitry 10. The control circuitry 22 may send one or more commands to the multi-phase clock generator circuitry 12 to adjust the operation thereof, for example, by changing a bias voltage and/or current provided to one or more elements therein to achieve proper injection locking as discussed in detail below.

In addition to the multi-phase clock generator circuitry 12, the frequency divider circuitry 14 also receives the input clock signal $CLK_{IN}$ and performs frequency division thereon to generate a reference signal REF, where the reference signal REF has a lower frequency than the input clock signal $CLK_{IN}$ and a different duty cycle than the input clock signal $CLK_{IN}$. As will be discussed in detail below, the frequency divider circuitry 14 is all digital, and thus relies upon edge-triggering for frequency division. While such an approach results in significant reductions in complexity and energy consumption, it also restricts the duty cycle at which the reference signal REF can be provided for fractional frequency division. When performing fractional frequency division, the duty cycle of the reference signal REF will be different than that of the input clock signal $CLK_{IN}$. For example, if the frequency divider circuitry 14 has a divisor equal to 2.5 and the input clock signal $CLK_{IN}$ has a duty cycle of 50%, the reference signal REF will have a duty cycle of 40%. Such limitations of the frequency divider circuitry 14 will be discussed in detail below. Those skilled in the art will appreciate that a 50% duty cycle for the reference signal REF may be required in certain applications, for example, when the reference signal REF is to be used as an input for additional frequency divider stages. The control circuitry 22 may send one or more commands to the frequency divider circuitry 14 in order to adjust one or more programmable parameters thereof. For example, the control circuitry 22 may adjust a divisor of the frequency divider circuitry 14 to change the relationship between the frequency of the reference signal REF and that of the input clock signal $CLK_{IN}$.

The signal retiming circuitry 16 receives the reference signal REF and generates a number of retiming signals RET (shown individually as $RET_1$ through $RET_N$) equal to the number of multi-phase clock signals $CLK_{MP}$. Each one of the retiming signals RET has the same frequency and duty cycle of the reference signal REF with a phase dictated by a corresponding one of the multi-phase clock signals $CLK_{MP}$. In other words, each one of the retiming signals RET is a replicated reference signal REF with a different phase shift with respect thereto. As will be discussed in detail below, the signal retiming circuitry 16 is also completely digital, resulting in savings in energy consumption.

The retiming signals RET from the signal retiming circuitry 16 are provided to the multiplexer circuitry 18, which in turn selectively delivers two of the retiming signals RET to the signal combining circuitry 20. Which of the retiming signals RET are delivered from the multiplexer circuitry 18 to the signal combining circuitry 20 may depend upon several factors such as the amount of phase shift between each one of the multi-phase clock signals $CLK_{MP}$, the division ratio of the frequency divider circuitry 14, and a desired amount of jitter in the resulting output signal of the frequency synthesizer circuitry 10, as discussed in detail below. The control circuitry 22 may send one or more commands to the multiplexer circuitry 18 to adjust one or more programmable parameters thereof. For example, the control circuitry 22 may send commands to the multiplexer circuitry 18 indicating which of the retiming signals RET should be delivered to the signal combining circuitry 20.

The signal combining circuitry 20 receives two of the retiming signals RET from the multiplexer circuitry 18 (shown as $RET_X$ and $RET_Y$) and combines these signals to provide an output clock signal $CLK_{OUT}$, where the output clock signal has the same frequency as the reference signal REF and a desired duty cycle, which in some embodiments may be equal to that of the input clock signal $CLK_{IN}$ (e.g., 50%). The signal combining circuitry 20 may be as simple as an OR logic gate in one embodiment. As discussed above, the retiming signals RET are phase-shifted versions of the reference signal REF. Accordingly, performing a logical OR on the selected retiming signals may alter the duty cycle without changing the frequency thereof. The result is an output clock signal $CLK_{OUT}$ that has both a desired frequency and a desired duty cycle even for fractional divisors.

Figure 2:
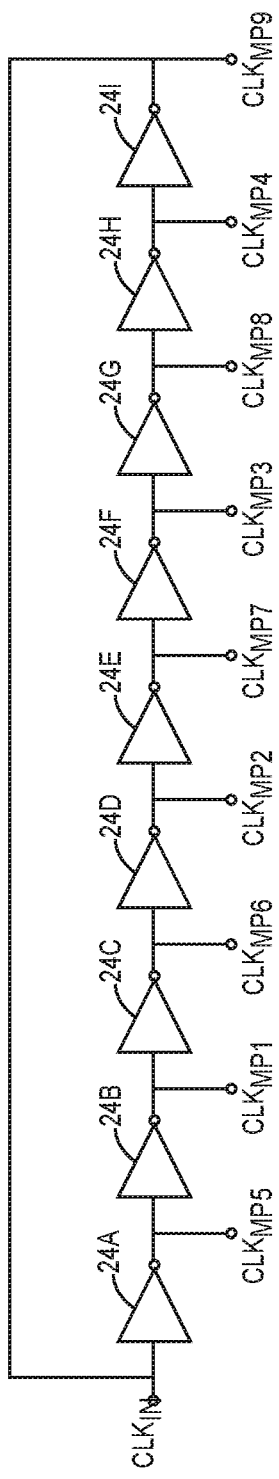
FIG. 2 is a diagram illustrating multi-phase clock generator circuitry according to one embodiment of the present disclosure.
Figure 2:
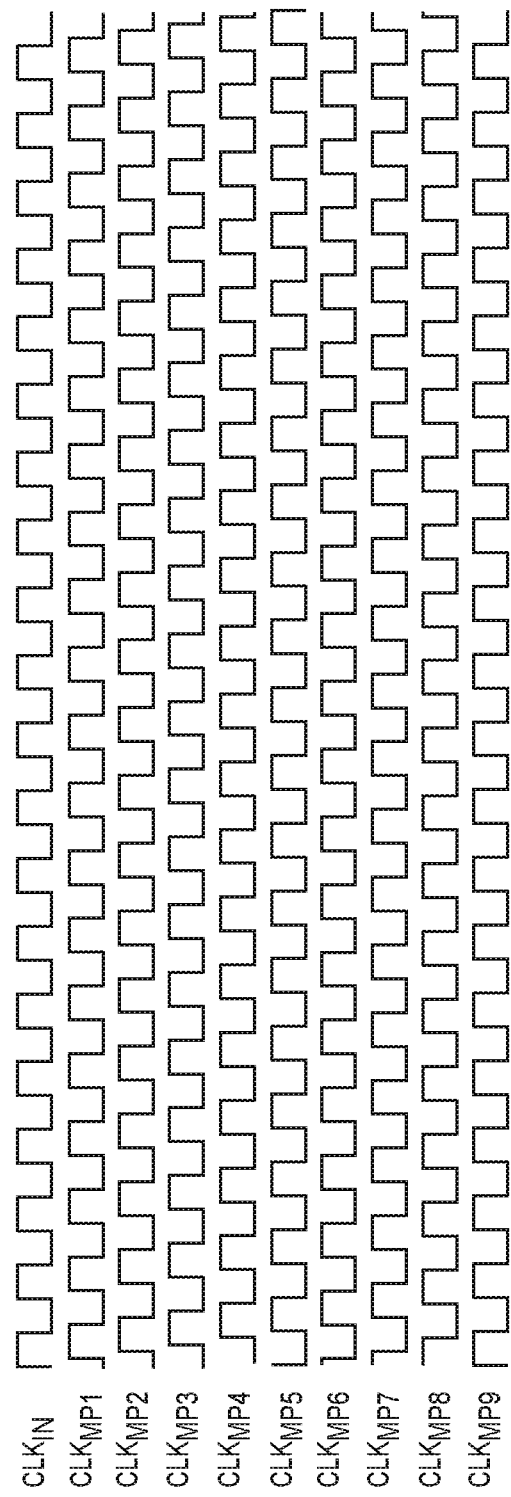

FIG. 2 is a diagram illustrating details of the multi-phase clock generator circuitry 12 according to one embodiment of the present disclosure. The multi-phase clock generator circuitry 12 shown in FIG. 2 is a nine-stage injection-locked ring oscillator formed by nine inverters 24 (shown individually as 24A through 24I) coupled in series, with a feedback loop extending from an output of a last one of the inverters 24I to an input of a first one of the inverters 24A. The input clock signal $CLK_{IN}$ is used for injection locking and is delivered to the input of the first one of the inverters 24A. An output of each one of the inverters 24 provides one of the multi-phase clock signals $CLK_{MP}$. A timing diagram illustrates the relationship between the input clock signal $CLK_{IN}$ and each one of the multi-phase clock signals $CLK_{MP}$, which are arranged to illustrate the progressive phase shift provided by the multi-phase clock generator circuitry 12. In the exemplary embodiment shown in FIG. 2, each one of the inverters 24 provides roughly 20° of phase shift with respect to an input signal provided thereto, such that a first one of the multi-phase clock signals $CLK_{MP1}$ has a 40° phase shift with respect to the input clock signal $CLK_{IN}$, a second one of the multi-phase clock signals $CLK_{MP2}$ has an 80° phase shift with respect to the input clock signal $CLK_{IN}$, a third one of the multi-phase clock signals $CLK_{MP3}$ has a 120° phase shift with respect to the input clock signal $CLK_{IN}$, and so forth, until finally a ninth one of the multi-phase clock signals $CLK_{MP9}$ provides a 360° phase shift with respect to the input clock signal $CLK_{IN}$ such that the ninth one of the multi-phase clock signals $CLK_{MP9}$ is aligned with the input clock signal $CLK_{IN}$.

The multi-phase clock signals $CLK_{MP}$ are not sequentially ordered in the diagram due to the fact that every odd numbered inverter 24 provides an additional 180° phase shift (inversion) on top of the 20°. Notably, the number of stages and phase shift provided by each one of the inverters 24 shown in FIG. 2 is merely exemplary. Those skilled in the art will readily appreciate that any number of stages may be included in the multi-phase clock generator circuitry 12, each of which provides any desired amount of phase shift, without departing from the principles herein. The number of stages and the phase shift provided thereby may be dependent on certain specifications of the frequency synthesizer circuitry 10 such as jitter. In one embodiment, the multi-phase clock generator circuitry 12 is programmable, such that the phase shift provided by each one of the inverters 24 may be selected, for example, by a command sent through a communications bus. Such a command may be used to change a bias voltage and/or current provided to each one of the inverters 24 thus changing the phase shift provided thereby. Using an injection-locked ring oscillator to generate the multi-phase clock signals $CLK_{MP}$ does so with minimal power consumption and complexity. Those skilled in the art will readily appreciate that the injection-locked ring oscillator requires only a single-phase input signal, which may allow the frequency synthesizer circuitry 10 to remain relatively simple.

Figure 3:
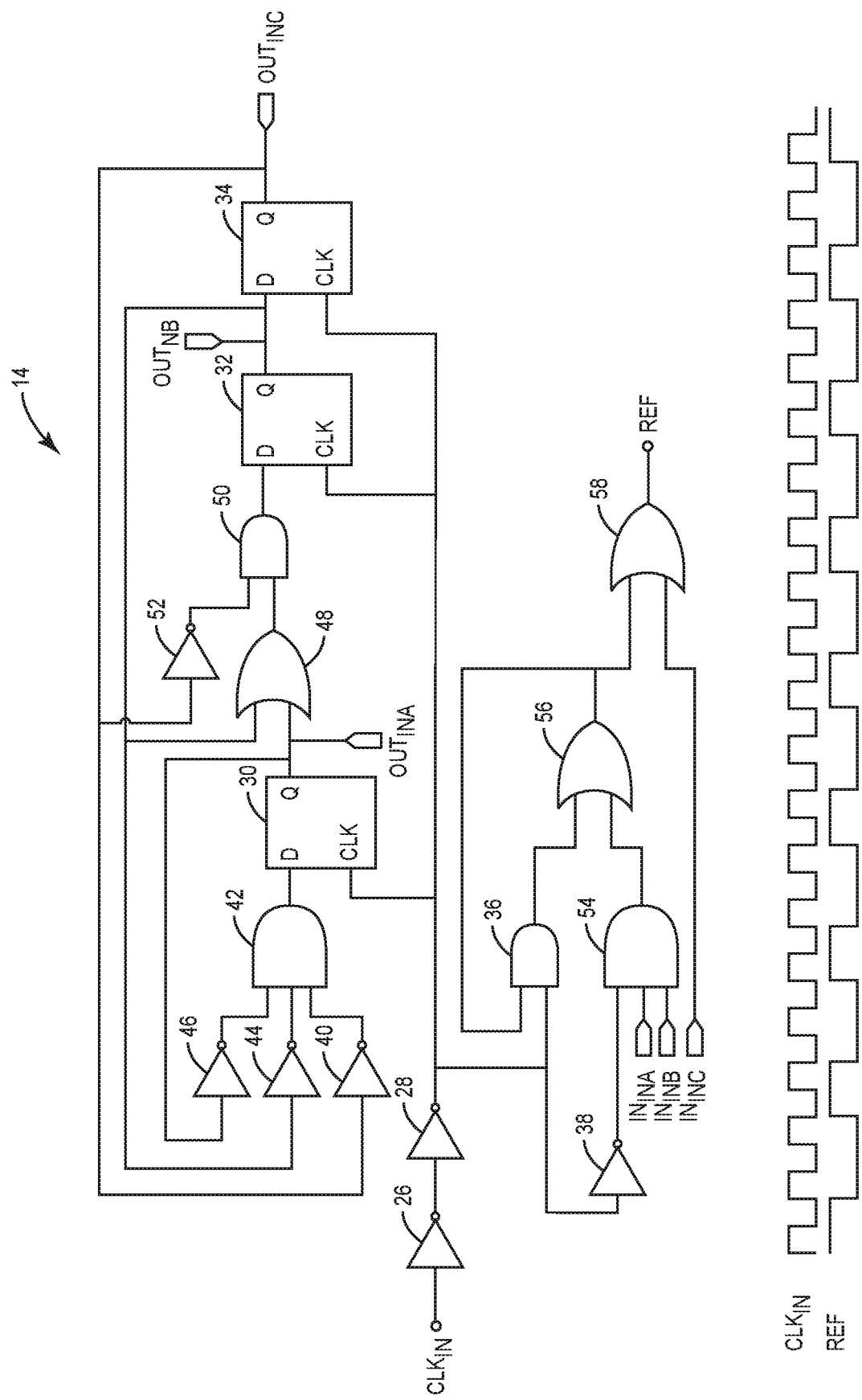
FIG. 3 is a diagram illustrating frequency divider circuitry according to one embodiment of the present disclosure.

FIG. 3 is a diagram illustrating details of the frequency divider circuitry 14 according to one embodiment of the present disclosure. The frequency divider circuitry 14 is an all-digital frequency divider including a first inverter 26 coupled in series with a second inverter 28. The input clock signal $CLK_{IN}$ is provided to an input of the first inverter 26. An output of the second inverter 28 is coupled to a clock input of a first D flip flop 30, a second D flip flop 32, and a third D flip flop 34, as well as to a first input of a first AND gate 36 and an input of a third inverter 38. An output of a fourth inverter 40 is coupled to a first input of a second AND gate 42, an output of a fifth inverter 44 is coupled to a second input of the second AND gate 42, and an output of a sixth inverter 46 is coupled to a third input of the second AND gate 42. An output of the second AND gate 42 is coupled to a data input of the first D flip flop 30. An output of the first D flip flop 30 is coupled to a first input of a first OR gate 48, to an input of the sixth inverter 46, and to a first intermediate output node $OUT_{INA}$. An output of the first OR gate 48 is coupled to a first input of a third AND gate 50. An output of the third AND gate 50 is coupled to a data input of the second D flip flop 32. An output of the second D flip flop 32 is coupled to a data input of the third D flip flop 34, to a second intermediate output node $OUT_{INB}$, to a second input of the first OR gate 48, and to an input of the fifth inverter 44. An output of the third D flip flop 34 is coupled to a third intermediate output node $OUT_{INC}$, to an input of a seventh inverter 52, and to an input of the fourth inverter 40. An output of the seventh inverter 52 is coupled to a second input of the third AND gate 50. The first intermediate output node $OUT_{INA}$ is coupled to a first intermediate input node $IN_{INA}$, which is coupled to a first input of a fourth AND gate 54. The second intermediate output node $OUT_{INB}$ is coupled to a second intermediate input node $IN_{INB}$, which is coupled to a second input of the fourth AND gate 54. An output of the third inverter 38 is coupled to a third input of the fourth AND gate 54. An output of the fourth AND gate 54 is coupled to a first input of a second OR gate 56. An output of the first AND gate 36 is coupled to a second input of the second OR gate 56. An output of the second OR gate 56 is coupled to a first input of a third OR gate 58 and a second input of the first AND gate 36. The third intermediate output node $OUT_{INC}$ is coupled to a third intermediate input node $IN_{INC}$, which is coupled to a second input of the third OR gate 58. The reference signal REF is provided by an output of the third OR gate 58.

A timing diagram for the frequency divider circuitry 14 illustrates the relationship between the input clock signal $CLK_{IN}$ and the reference signal REF. In the example shown in FIG. 3, the frequency divider circuitry 14 has a divisor of 2.5, such that a frequency of the reference signal REF is 2.5 times lower than that of the input clock signal $CLK_{IN}$. As discussed above, while the input clock signal $CLK_{IN}$ has a duty cycle of 50% as is typical for a standard clock signal, the reference signal has only a 40% duty cycle. This is due to the fact that the frequency divider circuitry is all digital and thus relies upon edge triggering to perform frequency division. To achieve a 50% duty cycle for the reference signal, the reference signal REF must transition from high to low at a quarter of the period of the input clock signal $CLK_{IN}$, which is not possible absent significant increases in the complexity of the frequency divider circuitry 14.

Using completely the digital frequency divider circuitry 14 may significantly reduce power consumption of the frequency synthesizer circuitry 10. Notably, the specifics of the frequency divider circuitry 14 shown in FIG. 3 are merely exemplary. Those skilled in the art will readily appreciate that a large number of all digital fractional frequency dividers exist that provide the same or a similar output to the circuitry shown in FIG. 3, all of which are contemplated herein.

Figure 4:
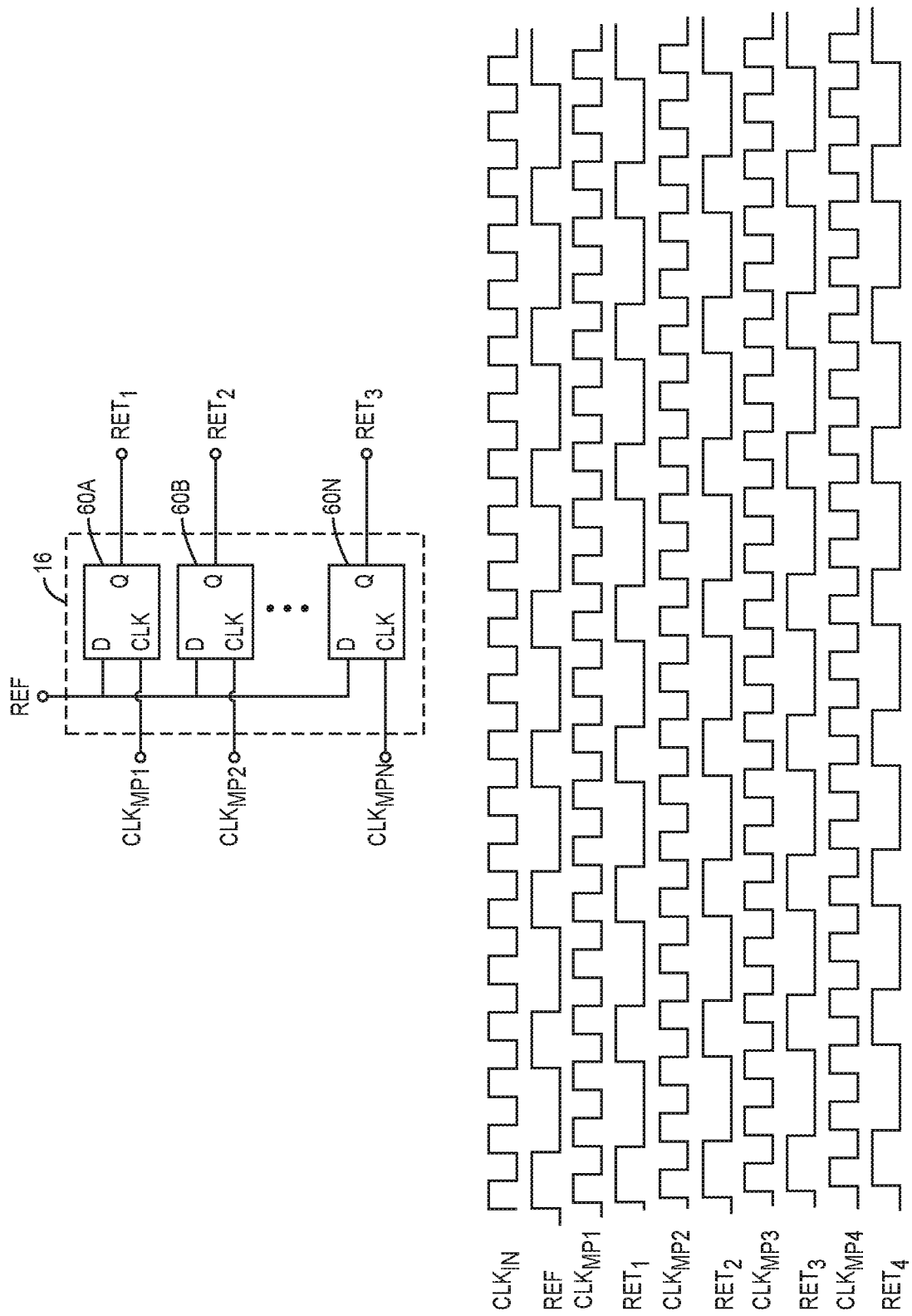
FIG. 4 is a diagram illustrating signal retiming circuitry according to one embodiment of the present disclosure.

FIG. 4 is a diagram illustrating details of the signal retiming circuitry 16 according to one embodiment of the present disclosure. The signal retiming circuitry 16 includes a number of dual-edge triggered flip flops 60 (shown individually as 60A through 60N), each of which includes a clock input coupled to the multi-phase clock generator circuitry 12 and configured to receive a different one of the multi-phase clock signals $CLK_{MP}$, a data input coupled to the frequency divider circuitry 14 and configured to receive the reference signal REF, and an output at which a retiming signal RET is provided (shown individually as $RET_1$-$RET_3$). A timing diagram illustrates the relationship between each retiming signal RET, the input clock signal $CLK_{IN}$, and the reference signal REF. As discussed above, each one of the multi-phase clock signals $CLK_{MP}$ has a different phase shift with respect to the input clock signal $CLK_{IN}$. These multi-phase clock signals $CLK_{MP}$ are used by each one of the dual-edge triggered flip flops 60 to shift the reference signal REF in phase by an amount dictated by the multi-phase clock signal $CLK_{MP}$ received to generate a retiming signal RET that is identical to the reference signal REF but also shifted in phase. Each dual-edge triggered flip flop 60 changes state only when the reference signal REF first changes state, followed by the multi-phase clock signal $CLK_{MP}$ provided thereto. As an example, at the first rising edge of the first multi-phase clock signal $CLK_{MP1}$ following a rising edge of the reference signal REF, the first retiming signal RET changes state to experience a rising edge. The first multi-phase clock signal $CLK_{MP1}$ then experiences a falling edge, but the reference signal REF has not changed during this time and thus the state of the first retiming signal $RET_1$ is not changed. Only when the first multi-phase clock signal $CLK_{MP}$ experiences a rising edge after a falling edge of the reference signal REF does the state of the first retiming signal $RET_1$ such that a falling edge occurs. The result is that each dual-edge triggered flip flop 60 provides a phase-shifted version of the reference signal REF as a retiming signal RET, where the phase shift of each one of the retiming signals RET is determined by one of the multi-phase clock signals $CLK_{MP}$. Following the example set up in FIG. 2 where each one of the multi-phase clock signals $CLK_{MP}$ provides a 40° phase shift with respect to the input clock signal $CLK_{IN}$, each one of the retiming signals RET provided by the signal retiming circuitry 16 is also shifted in phase by 40° with respect to the reference signal REF.

Figure 5:
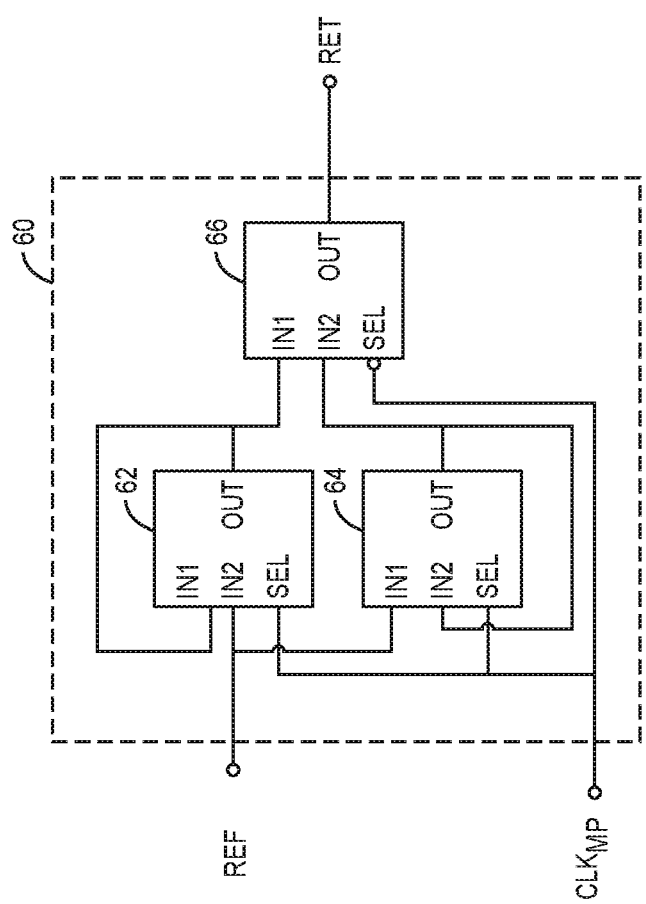
FIG. 5 is a diagram illustrating a dual-edge triggered flip flop according to one embodiment of the present disclosure.

FIG. 5 is a diagram illustrating details of a dual-edge triggered flip flop 60 according to one embodiment of the present disclosure. The dual-edge triggered flip flop 60 includes a first multiplexer 62, a second multiplexer 64, and a third multiplexer 66. A multi-phase clock signal $CLK_{MP}$ is provided to a select input SEL of each one of the first multiplexer 62, the second multiplexer 64, and the third multiplexer 66 (however, the multi-phase clock signal $CLK_{MP}$ is inverted, or opposite in phase at the select input SEL of the third multiplexer 66 as indicated by the circle through which it is connected thereto). When the select input SEL of each one of the multiplexers is high, the signal at a first input IN1 thereof is provided to the output OUT. When the select input SEL of each one of the multiplexers is low, the signal at a second input IN2 thereof is provided to the output OUT. The first input IN1 of the first multiplexer 62 is coupled to the output OUT of the first multiplexer 62, which is in turn coupled to the first input IN1 of the third multiplexer 66. The second input IN2 of the first multiplexer 62 is configured to receive the reference signal REF. The first input IN1 of the second multiplexer 64 is configured to receive the reference signal REF as well. The second input IN2 of the second multiplexer 64 is coupled to the output OUT of the second multiplexer 64, which is in turn coupled to the second input IN2 of the third multiplexer 66. An output of the third multiplexer 66 provides the retiming signal RET. The feedback loops formed between the first input IN1 and the output OUT of the first multiplexer 62 and the second input IN2 and the output OUT of the second multiplexer 64 create a latching type structure that is triggered on either a rising or falling edge of the multi-phase clock signal $CLK_{MP}$ that occurs after a rising or falling edge of the reference signal REF, as illustrated in the timing diagram shown in FIG. 4.

The multiplexer circuitry 18 may comprise a typical multiplexer configured to deliver a selected two of the retiming signals RET to the signal combining circuitry 20 based on a select input signal provided thereto. Notably, the multiplexer circuitry 18 may be optional. In some embodiments, the multiplexer circuitry 18 may be omitted and the signal retiming circuitry 16 coupled directly to the signal combining circuitry 20 where the correct retiming signals RET to form a desired output clock signal $CLK_{OUT}$ are known ahead of time for the application. In such an embodiment, the signal retiming circuitry 14 may include only those dual-edge triggered flip-flops 60 necessary for generating the pre-designated retiming signal RET that is hard-wired to the signal combining circuitry 20.

Figure 6:
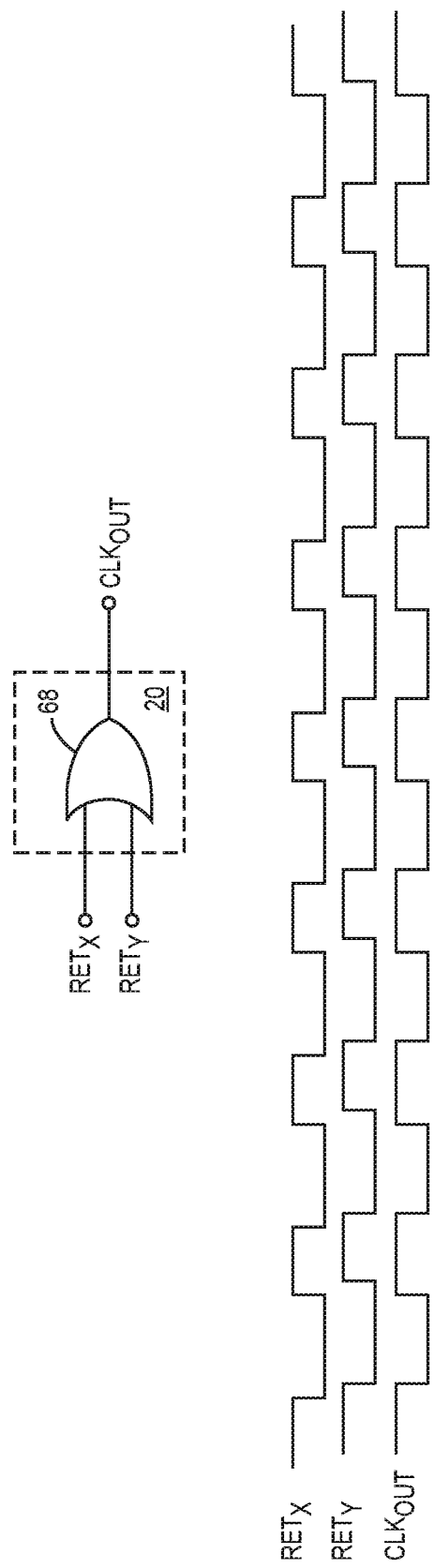
FIG. 6 is a diagram illustrating signal combining circuitry according to one embodiment of the present disclosure.

As discussed above, the signal combining circuitry 20 may comprise a simple OR gate or more complex logic circuitry depending on the application. FIG. 6 shows the signal combining circuitry 20 as an OR gate 68 according to one embodiment of the present disclosure. The OR gate 68 receives two of the retiming signals RET from the multiplexer circuitry 18, and provides the output clock signal $CLK_{OUT}$ at an output. A timing diagram illustrates the relationship between a first one of the retiming signals $RET_X$, a second one of the retiming signals $RET_Y$, and the output clock signal $CLK_{OUT}$. As shown, the OR gate 68 combines the high pulses of the retiming signals RET to extend the duration of the high pulse and thus the duty cycle of the output clock signal $CLK_{OUT}$ as desired. In the specific example shown in FIG. 6, the retiming signals RET are combined to provide the output clock signal $CLK_{OUT}$ with nearly a 50% duty cycle.

As discussed above with respect to FIG. 1, the control circuitry 22 may send the necessary control signals to the multi-phase clock generator circuitry 12, the frequency divider circuitry 14, and the multiplexer circuitry 18 in order to provide the output clock signal $CLK_{OUT}$ with a desired frequency and duty cycle. Specifically, the control circuitry 22 may send one or more control signals to the multi-phase clock generator circuitry 12 in order to adjust a bias voltage and/or bias current provided to the elements therein, which may in turn affect the phase of the multi-phase clock signals $CLK_{MP}$ provided therefrom. The control circuitry 22 may send one or more control signals to the frequency divider circuitry 14 in order to adjust a divisor thereof (e.g., 1, 1.5, 2, 2.5, 3, 3.5, 4, 4.5, etc.). Finally, the control circuitry 22 may send one or more control signals to the multiplexer circuitry 18 to determine which of the retiming signals RET are provided to the signal combining circuitry 20 for combining with the reference signal REF. Assuming the duty cycle of the reference signal REF is c, where c is between 0% and 50% and the desired duty cycle for the output clock signal $CLK_{OUT}$ is 50%, the required phase shift ΔΦ in radians between the retiming signal RET provided to the signal combining circuitry 20 and the reference signal REF is determined according to Equation (1):

$$\Delta\Phi=(0.5-c)*2\pi*N \quad (1)$$

where N is the divisor of the frequency divider circuitry 14. To achieve this phase shift ΔΦ, the $k^{th}$ retiming signal RET_k (generated using the $k^{th}$ multi-phase clock signal $CLK_{MP}k$ as discussed above) is selected to be combined with the reference signal REF at the signal combining circuitry 20, where k is determined according to Equation (2):

$$k=(0.5-c)*N*n \quad (2)$$

where n is the number of stages of the multi-phase clock generator circuitry 12. In some cases, k may not be an integer. In such a case, the integer value closest to k is chosen, resulting in a systematic jitter σ that is determined according to Equation (3):

$$\sigma = |k-d| * \frac{1}{n} * \frac{1}{f_0} \quad (3)$$

where d is the integer closest to k and $f_0$ is the frequency of the input clock signal $CLK_{IN}$.

Figure 7:
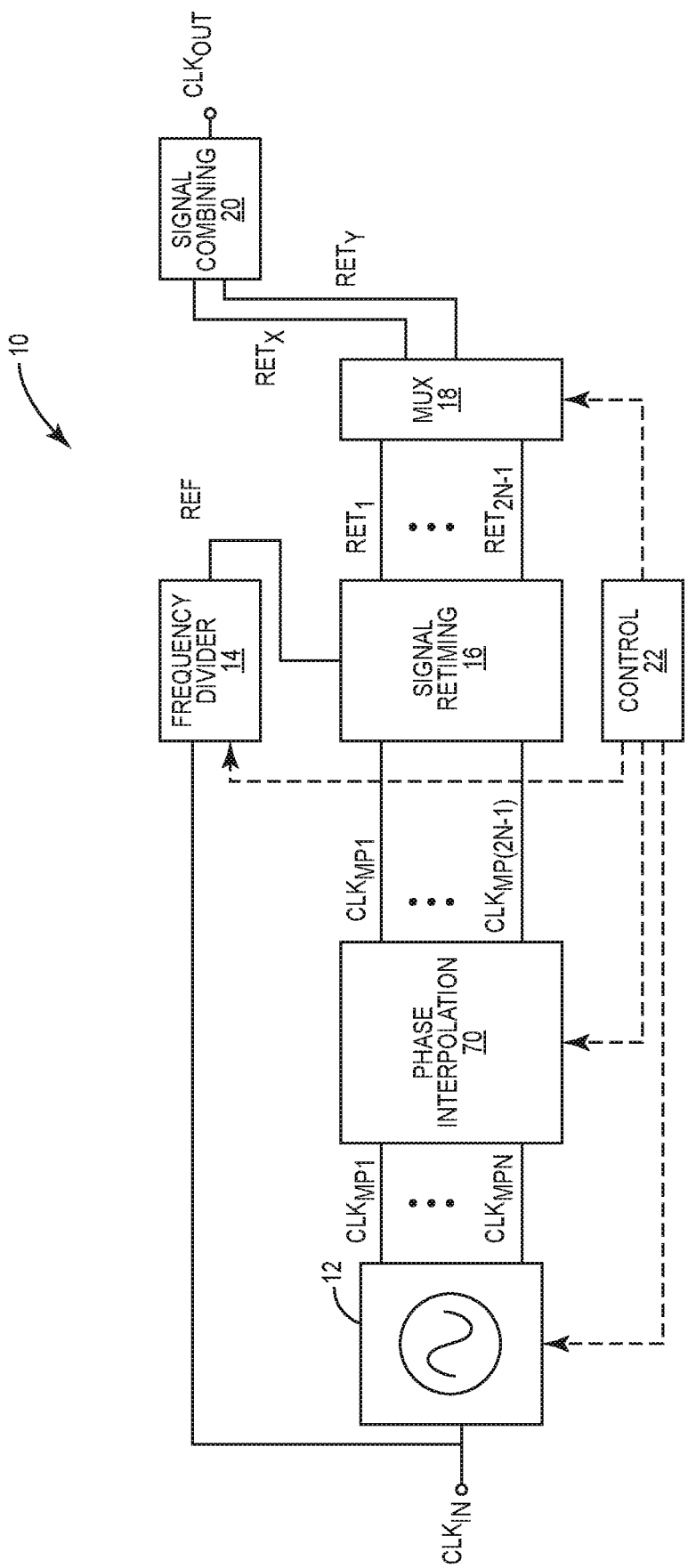
FIG. 7 is a diagram illustrating frequency synthesizer circuitry according to one embodiment of the present disclosure.

If the systematic jitter is too high, the frequency synthesizer circuitry 10 may require additional resolution from the multi-phase clock generator circuitry 12. That is, the frequency synthesizer circuitry 10 may require additional multi-phase clock signals $CLK_{MP}$ having finer-grained phase shifts. While stages can be added to the multi-phase clock generator circuitry 12 shown in FIG. 2, this may increase power consumption and start-up times. Accordingly, FIG. 7 shows the frequency synthesizer circuitry 10 further including phase interpolator circuitry 70 between the multi-phase clock generator circuitry 12 and the signal retiming circuitry 16. The phase interpolator circuitry 70 increases the number of multi-phase clock signals $CLK_{MP}$ from N to 2N−1, increasing the resolution of multi-phase clock signals $CLK_{MP}$ available to the signal retiming circuitry 16. Such resolution may be necessary to avoid jitter at certain divisors for the frequency divider circuitry 14. Continuing the example discussed above, a divisor of 2.5 for the frequency divider circuitry requires a 90° phase shift between the retiming signals RET combined at the signal combining circuitry 20 to achieve a perfect 50% duty cycle in the output clock signal $CLK_{OUT}$. The multi-phase clock generator circuitry 12 shown in FIG. 2 provides multi-phase clock signals $CLK_{MP}$ having a 40° phase shift with respect to one another, which allows the output clock signal $CLK_{OUT}$ to get very close to 50% duty cycle (using the second multi-phase clock signal $CLK_{MP2}$ having an 80° phase shift), resulting in a systematic jitter σ=3.33*10$^{-8}$ (for a $f_0$ of 32 MHz). If the specification for the frequency synthesizer circuitry 10 were strict enough, the phase interpolator circuitry 70 may be required to provide further phase resolution and thus accuracy in the duty cycle of the output clock signal $CLK_{OUT}$. Where the phase interpolator circuitry 70 is used, Equation (2) may be rewritten as Equation (4):

$$k=(0.5-c)*[2^{b}*(n-1)+1]*N \quad (4)$$

where b is the number of stages in the phase interpolator circuitry 70 as discussed below. Notably, the number of stages b in the phase interpolator circuitry 70 may be chosen such that k is as close to an integer as possible.

Figure 8:
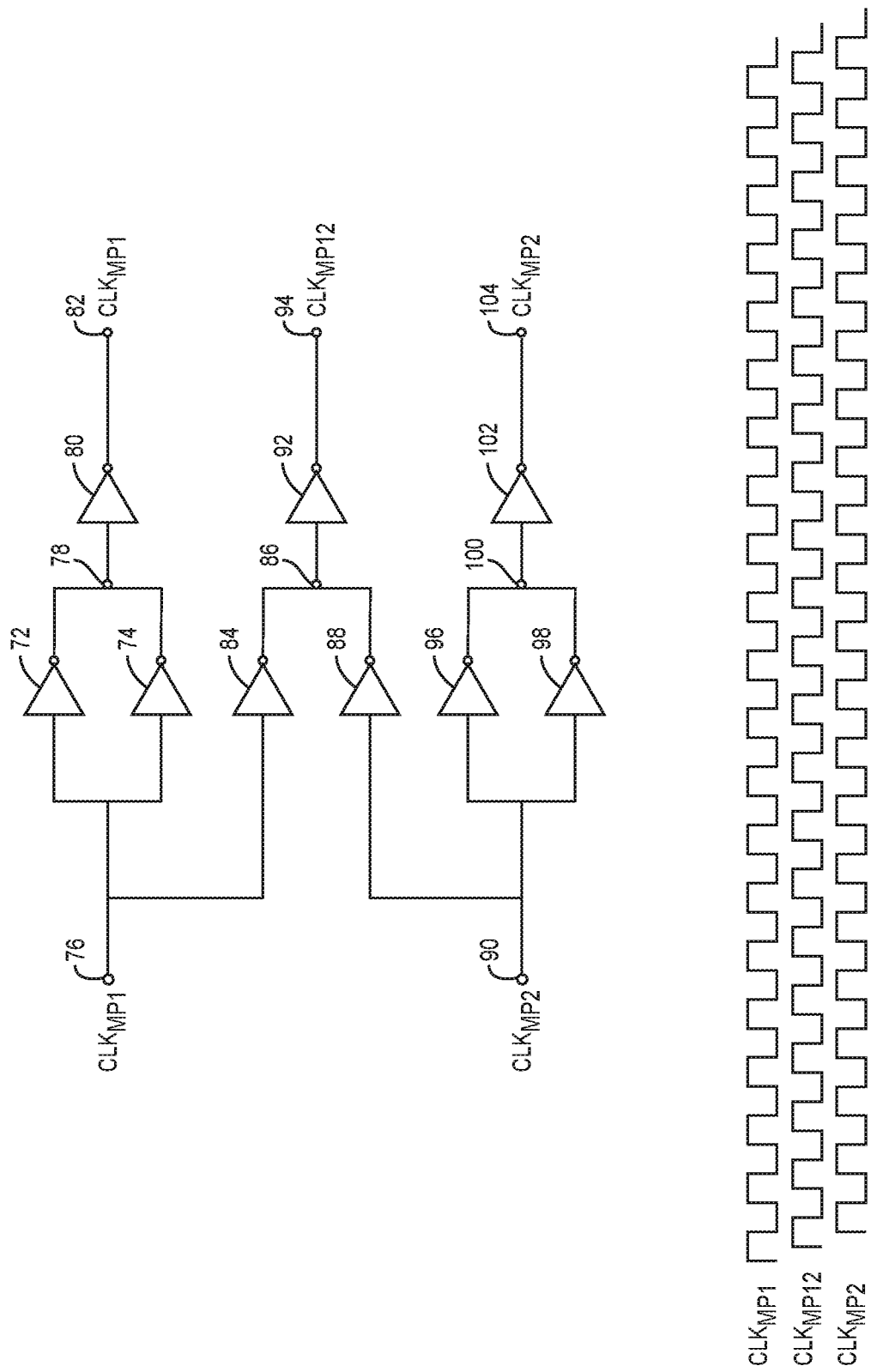
FIG. 8 is a diagram illustrating phase interpolator circuitry according to one embodiment of the present disclosure.

FIG. 8 is a diagram illustrating details of the phase interpolator circuitry 70 according to one embodiment of the present disclosure. The phase interpolator circuitry 70 includes a first inverter 72 coupled in parallel with a second inverter 74 between a first input node 76 and a first intermediate node 78. A third inverter 80 is coupled between the first intermediate node 78 and a first output node 82. A fourth inverter 84 is coupled between the first input node 76 and a second intermediate node 86. A fifth inverter 88 is coupled between a second input node 90 and the second intermediate node 86. A sixth inverter 92 is coupled between the second intermediate node 86 and a second output node 94. An eighth inverter 96 and a ninth inverter 98 are coupled in parallel between the second input node 90 and a third intermediate node 100. A tenth inverter 102 is coupled between the third intermediate node 100 and a third output node 104.

A timing diagram illustrates the relationship between the first multi-phase clock signal $CLK_{MP1}$, the second multi-phase clock signal $CLK_{MP2}$, and a first interpolated multi-phase clock signal $CLK_{MP12}$. As illustrated, the first interpolated multi-phase clock signal $CLK_{MP12}$ has a phase shift that is roughly halfway between the phase shift between the first multi-phase clock signal $CLK_{MP1}$ and the second multi-phase clock signal $CLK_{MP2}$. Notably, such a relationship between the clock signals is merely exemplary, and by changing a bias voltage and/or current provided to the inverters in the phase interpolator circuitry 70 this phase shift can be adjusted as desired to provide a desired phase resolution. As discussed above, the number of stages in the phase interpolator circuitry 70 may be chosen to achieve a desired phase shift and thus systematic jitter in the output clock signal $CLK_{OUT}$.

Figure 9:
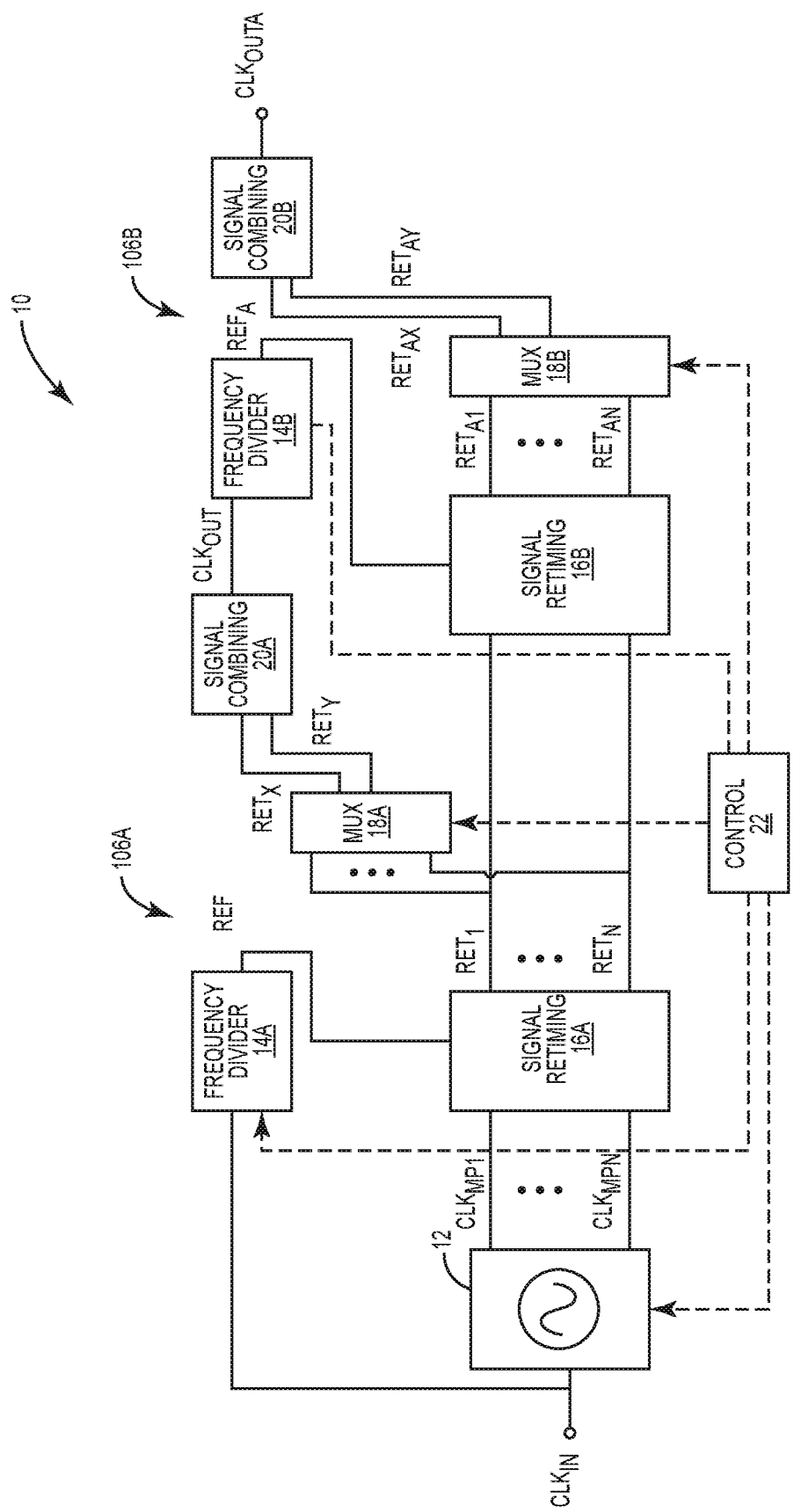
FIG. 9 is a diagram illustrating frequency synthesizer circuitry according to one embodiment of the present disclosure.

In some embodiments, the frequency synthesizer circuitry 10 may require multiple stages to achieve a desired output frequency. Accordingly, FIG. 9 shows the frequency synthesizer circuitry 10 including an additional stage, such that the frequency synthesizer circuitry 10 includes the multi-phase clock generator circuitry 12, first frequency divider circuitry 14A, first signal retiming circuitry 16A, first multiplexer circuitry 18A, first signal combining circuitry 20A, second frequency divider circuitry 14B, second signal retiming circuitry 16B, second multiplexer circuitry 18B, second signal combining circuitry 20B, and the control circuitry 22. The multi-phase clock generator circuitry 12 is coupled to the first signal retiming circuitry 16A. The first frequency divider circuitry 14A is coupled to the first signal retiming circuitry 16A. The first multiplexer circuitry 18A is coupled between the first signal retiming circuitry 16A and the first signal combining circuitry 20A. The first signal combining circuitry 20A is coupled to the second frequency divider circuitry 14B. In addition to being coupled to the first multiplexer circuitry 18A, the first signal retiming circuitry 16A is also coupled to the second signal retiming circuitry 16B. The second frequency divider circuitry 14B is coupled to the second signal retiming circuitry 16B The second multiplexer circuitry 18B is coupled between the second signal retiming circuitry 16B and the second signal combining circuitry 20B. The control circuitry 22 is coupled to the multi-phase clock generator circuitry 12, the first frequency divider circuitry 14A, the first multiplexer circuitry 18A, the second frequency divider circuitry 14B, and the second multiplexer circuitry 18B. In operation, the circuitries shown in FIG. 9 operate in the same manner as discussed above. The first frequency divider circuitry 14A, the first signal retiming circuitry 16A, the first multiplexer circuitry 18A, and the first signal combiner circuitry 20A form a first frequency divider stage 106A of the frequency synthesizer circuitry 10, while the second frequency divider circuitry 14B, the second signal retiming circuitry 16B, the second multiplexer circuitry 18B, and the second signal combiner circuitry 20B form a second frequency divider stage 106B of the frequency synthesizer circuitry 10. The first frequency divider stage 106A operates exactly as described above, providing the output clock signal $CLK_{OUT}$ at an output of the first signal combining circuitry 20A. The output clock signal $CLK_{OUT}$ from the first frequency divider stage 106A is provided as an input to the second frequency divider circuitry 14B, which generates an additional reference signal $REF_A$ as discussed above, which is provided to the second signal retiming circuitry 16B. Instead of receiving multi-phase clock signals $CLK_{MP}$ from the multi-phase clock generator circuitry 12, the second signal retiming circuitry 16B receives the retiming signals RET from the first signal retiming circuitry 16A. Using the additional reference signal $REF_A$ and the retiming signals RET, the second signal retiming circuitry 16B generates a set of additional retiming signals $RET_A$ (shown individually as $RET_{A1}$ through $RET_{AN}$). The second multiplexer circuitry 18B provides two of the additional retiming signals $RET_A$ to the second signal combining circuitry 20B (shown as $RET_{AX}$ and $RET_{AY}$), where they are combined to generate an additional output clock signal $CLK_{OUTA}$ as discussed above. The control circuitry 22 may provide control signals as discussed above to adjust the operation of the frequency synthesizer circuitry 10.

Those skilled in the art will recognize improvements and modifications to the preferred embodiments of the present disclosure. All such improvements and modifications are considered within the scope of the concepts disclosed herein and the claims that follow.

What is claimed is:
1. Frequency synthesizer circuitry comprising:
multi-phase clock generator circuitry configured to:
   receive an input clock signal; and
   generate a plurality of multi-phase clock signals based on the input clock signal such that a frequency of each one of the plurality of multi-phase clock signals is equal to a frequency of the input clock signal, a duty cycle of each one of the plurality of multi-phase clock signals is equal to a duty cycle of the input clock signal, and each one of the plurality of multi-phase clock signals has a different phase shift with respect to the input clock signal;
frequency divider circuitry coupled to the multi-phase clock generator circuitry and configured to:
   receive the input clock signal; and
   generate a reference signal based on the input clock signal such that a frequency of the reference signal is lower than the frequency of the input clock signal and a duty cycle of the reference signal is different from the duty cycle of the input clock signal;
signal retiming circuitry coupled to the multi-phase clock generator circuitry and the frequency divider circuitry and configured to:
   receive the reference signal and the plurality of multi-phase clock signals; and
   generate a plurality of retiming signals, each based on the reference signal and a different one of the plurality of multi-phase clock signals such that a frequency of each one of the plurality of retiming signals is equal to the frequency of the reference signal, a duty cycle of each one of the plurality of retiming signals is equal to the duty cycle of the reference signal, and a phase of each one of the plurality of retiming signals is shifted with respect to the reference signal by an amount determined by the one of the plurality of multi-phase clock signals used to generate the retiming signal; and
signal combining circuitry configured to combine two retiming signals of the plurality of retiming signals to generate an output clock signal such that a frequency of the output clock signal is equal to the frequency of the reference signal and a duty cycle of the output clock signal is equal to the duty cycle of the input clock signal.

2. The frequency synthesizer circuitry of claim 1 wherein the multi-phase clock generator circuitry is an injection locked ring oscillator.

3. The frequency synthesizer of claim 2 wherein the input clock signal is a single-phase signal.

4. The frequency synthesizer circuitry of claim 2 wherein the frequency divider circuitry is digital frequency divider circuitry.

5. The frequency synthesizer circuitry of claim 4 wherein the frequency divider circuitry is programmable in order to change the frequency of the reference signal.

6. The frequency synthesizer circuitry of claim 1 further comprising:
additional frequency divider circuitry coupled to the signal retiming circuitry and configured to:
   receive the output clock signal; and
   generate an additional reference signal based on the output clock signal such that a frequency of the additional reference signal is lower than the frequency of the output clock signal and a duty cycle of the additional reference signal is different from the duty cycle of the output clock signal; and
additional signal retiming circuitry coupled to the signal retiming circuitry and the additional frequency divider circuitry and configured to:
   receive the additional reference signal and the plurality of retiming signals; and
   generate an additional plurality of retiming signals, each based on the additional reference signal and a different one of the plurality of retiming signals such that a frequency of each one of the plurality of additional retiming signals is equal to the frequency of the additional reference signal, a duty cycle of each one of the plurality of additional retiming signals is equal to the duty cycle of the additional reference signal, and a phase of each one of the plurality of additional retiming signals is shifted with respect to the reference signal by an amount determined by the one of the plurality of retiming signals used to generate the additional retiming signal; and
additional signal combining circuitry configured to combine two additional retiming signals of the plurality of additional retiming signals to generate an additional output clock signal such that a frequency of the additional output clock signal is equal to the frequency of the additional reference signal and a duty cycle of the additional output clock signal is different from the duty cycle of the additional reference signal.

7. The frequency synthesizer circuitry of claim 6 wherein the multi-phase clock generator circuitry is an injection locked ring oscillator.

8. The frequency synthesizer of claim 7 wherein the input clock signal is a single-phase signal.

9. The frequency synthesizer circuitry of claim 6 wherein the frequency divider circuitry and the additional frequency divider circuitry are digital circuitry.

10. The frequency synthesizer circuitry of claim 9 wherein the frequency divider circuitry and the additional frequency divider circuitry are programmable in order to change the frequency of the reference signal and the additional reference signal, respectively.

11. The frequency synthesizer circuitry of claim 1 wherein the frequency synthesizer circuitry is digital circuitry.

12. Frequency synthesizer circuitry comprising:
multi-phase clock generator circuitry configured to:
receive an input clock signal; and
generate a plurality of multi-phase clock signals based on the input clock signal such that a frequency of each one of the plurality of multi-phase clock signals is equal to a frequency of the input clock signal, a duty cycle of each one of the plurality of multi-phase clock signals is equal to a duty cycle of the input clock signal, and each one of the plurality of multi-phase clock signals has a different phase shift with respect to the input clock signal;
phase interpolation circuitry coupled to the multi-phase clock generator circuitry and configured to receive each one of the plurality of multi-phase clock signals and generate an additional plurality of multi-phase clock signals such that a frequency of each one of the additional plurality of multi-phase clock signals is equal to the frequency of each one of the plurality of multi-phase clock signals, a duty cycle of each one of the additional plurality of multi-phase clock signals is equal to the duty cycle of each one of the plurality of multi-phase clock signals, and a phase of each one of the additional plurality of multi-phase clock signals is interpolated to be between a pair of multi-phase clock signals of the plurality of multi-phase clock signals;
frequency divider circuitry coupled to the phase interpolator circuitry and configured to:
receive the input clock signal; and
generate a reference signal based on the input clock signal such that a frequency of the reference signal is lower than the frequency of the input clock signal and a duty cycle of the reference signal is different from the duty cycle of the input clock signal;
signal retiming circuitry coupled to the phase interpolator circuitry and the frequency divider circuitry and configured to:
receive the reference signal, the plurality of multi-phase clock signals, and the additional plurality of multi-phase clock signals;
generate a plurality of retiming signals, each based on the reference signal and a different one of the plurality of multi-phase clock signals and the additional plurality of multi-phase clock signals such that a frequency of each one of the plurality of retiming signals is equal to the frequency of the reference signal, a duty cycle of each one of the plurality of retiming signals is equal to the duty cycle of the reference signal, and a phase of each one of the plurality of retiming signals is shifted with respect to the reference signal by an amount determined by one multi-phase clock signal of the plurality of multi-phase clock signals and the additional plurality of multi-phase clock signals used to generate the retiming signal; and
signal combining circuitry coupled to the signal retiming circuitry and configured to combine two retiming signals of the plurality of retiming signals to generate an output clock signal such that a frequency of the output clock signal is equal to the frequency of the reference signal and a duty cycle of the output clock signal is different from the duty cycle of the reference signal.

13. The frequency synthesizer circuitry of claim 12 further comprising multiplexer circuitry coupled between the signal retiming circuitry and the signal combining circuitry and configured to select one of the plurality of retiming signals provided to the signal combining circuitry to generate the output signal.

14. The frequency synthesizer circuitry of claim 13 wherein the one of the plurality of retiming signals is chosen based on an output jitter specification.

15. The frequency synthesizer circuitry of claim 12 wherein the multi-phase clock generator circuitry is an injection locked ring oscillator.

16. The frequency synthesizer of claim 15 wherein the input clock signal is a single-phase signal.

17. Frequency synthesizer circuitry comprising:
multi-phase clock generator circuitry configured to:
receive an input clock signal; and
generate a plurality of multi-phase clock signals based on the input clock signal such that a frequency of each one of the plurality of multi-phase clock signals is equal to a frequency of the input clock signal, a duty cycle of each one of the plurality of multi-phase clock signals is equal to a duty cycle of the input clock signal, and each one of the plurality of multi-phase clock signals has a different phase shift with respect to the input clock signal;
frequency divider circuitry coupled to the multi-phase clock generator circuitry and configured to:
receive the input clock signal; and
generate a reference signal based on the input clock signal such that a frequency of the reference signal is lower than the frequency of the input clock signal and a duty cycle of the reference signal is different from the duty cycle of the input clock signal;
signal retiming circuitry coupled to the phase interpolator circuitry and the frequency divider circuitry and configured to:
receive the reference signal and the plurality of multi-phase clock signals; and
generate a plurality of retiming signals, each based on the reference signal and a different one of the plurality of multi-phase clock signals such that a frequency of each one of the plurality of retiming signals is equal to the frequency of the reference signal, a duty cycle of each one of the plurality of retiming signals is equal to the duty cycle of the reference signal, and a phase shift of each one of the plurality of retiming signals with respect to the reference signal is determined by one of the plurality of multi-phase clock signals used to generate the retiming signal; and signal combining circuitry coupled to the signal retiming circuitry and configured to combine two retiming signals of the plurality of retiming signals to generate an output clock signal such that a frequency of the output clock signal is equal to the frequency of the reference signal and a duty cycle of the output clock signal is different from the duty cycle of the reference signal; and multiplexer circuitry coupled between the signal retiming circuitry and the signal combining circuitry and configured to select two retiming signals of the plurality of retiming signals to provide to the signal combining circuitry to generate the output signal.

18. The frequency synthesizer circuitry of claim 17 wherein the two retiming signals of the plurality of retiming signals are chosen based on an output jitter specification.

* * * * *